United States Patent [19]

Hupe et al.

[11] Patent Number: 5,194,313
[45] Date of Patent: Mar. 16, 1993

[54] THROUGH-HOLE PLATED PRINTED CIRCUIT BOARD AND PROCESS FOR MANUFACTURING SAME

[75] Inventors: Jurgen Hupe, Langenfeld; Walter Kronenberg, Cologne, both of Fed. Rep. of Germany

[73] Assignee: Blas-Berg-Oberflachentechnik GmbH, Solingen, Fed. Rep. of Germany

[21] Appl. No.: 573,042

[22] PCT Filed: Mar. 1, 1989

[86] PCT No.: PCT/EP89/00204
  § 371 Date: Aug. 17, 1990
  § 102(e) Date: Aug. 17, 1990

[87] PCT Pub. No.: WO89/08375
  PCT Pub. Date: Sep. 8, 1989

[30] Foreign Application Priority Data

Mar. 3, 1988 [DE]  Fed. Rep. of Germany ....... 3806884
  Sep. 24, 1988 [DE]  Fed. Rep. of Germany ....... 3832507

[51] Int. Cl.⁵ .............................................. B32B 3/10
[52] U.S. Cl. .................................... 428/137; 428/195; 428/209; 428/409; 428/457; 361/397; 427/96; 156/625; 156/654; 156/657; 156/662; 156/668
[58] Field of Search ............... 428/137, 195, 209, 409, 428/457; 361/397; 427/96; 204/6; 156/625, 654, 657, 662, 668

[56] References Cited

FOREIGN PATENT DOCUMENTS 0248683 12/1987 European Pat. Off. .

OTHER PUBLICATIONS

E. M. Engler, IBM Technical Disclosure Bulletin, vol. 22 (1), p. 393 (Jun. 1979).
K. C. Kulbe et al., Journal of Polymer Science: Polymer Science: Polymer Chemistry Edition, vol. 20, pp. 1089–1095 (1982).

Primary Examiner—Patrick J. Ryan
Assistant Examiner—Elizabeth Evans
Attorney, Agent, or Firm—Wegner, Cantor, Mueller & Player

[57] ABSTRACT

A process is described for manufacturing through-hole plated single-layer or multi-layer printed circuit boards based on a polymeric substrate material or on a ceramic material provided optionally on both sides with at least one electroconductive layer by electroplating or electroless plating with a metal layer also on those surfaces which have not been coated with a conductive metal layer, said process being characterized in that a) the surfaces of the substrate are pre-treated in a solution having oxidizing activity, b) after removal of the residual soltuion by rinsing, the substrate is introduced into a solution which contains at least one monomer, and more specifically pyrrole, furane, thiophene or derivative(s) thereof, which in a polymeric or copolymeric form is electrically conductive, c) the substrate is then transferred into an acidic solution whereby an electrically conductive polymeric layer is formed, more specifically of polymerized or copolymerized pyrrole, furane, thiophene or derivative(s) thereof, whereupon, if desired or required, any residual solution is removed by rinsing, and the galvanic or electroless metallization is carried out.

15 Claims, No Drawings

THROUGH-HOLE PLATED PRINTED CIRCUIT BOARD AND PROCESS FOR MANUFACTURING SAME

The present invention relates to a process for manufacturing through-hole plated single-layer or multi-layer printed circuit boards based on a polymeric substrate material or on ceramics provided optionally on both sides with at least one electroconductive layer by galvanic or electroplating or electroless plating with a metal layer also on those surfaces which have not been coated with a conductive metal layer; the invention further relates to the printed circuit boards themselves.

Through-hole plated printed circuit boards so far have been essentially produced by chemical metal deposition on catalytically activated surfaces of a substrate material. Multi-layer printed circuit boards are also prepared in this manner. The metal layers having been deposited without external current (electroless) are then further reinforced, if desired, by metal-electroplating (galvanic metal deposition). This technology enables high-quality printed circuit boards to be manufactured. The catalytic activation of the surface is generally effected by means of ionic or non-ionic noble metal-containing catalysts which, more specifically are based on palladium and tin. However, systems containing no noble metals, for example based on copper, may also be used. In some cases, there has also been known the use of catalytically active layers which have been applied by a physical method, for example by vapor deposition.

The methods have been described in the pretinent literature, for example in Hermann, Handbuch der Leiterplattentechnik, Eugen G. Leuze Verlag, Saulgau. The wet-chemical catalysis employed in practice with the use of systems containing noble metals or containing no noble metals generally proceeds by the following route:

1. Cleaning/conditioning
2. Rinsing
3. Activating/initial etching
4. Rinsing
5. Pre-immersion solution
6. Application of the catalyst
7. Rinsing
8. Addition of an accelerator/reductor
9. Anew rinsing
10. Electroless metallization
11. Rinsing
12. Drying.

The quality of nucleation (catalysis) and, hence, the quality of the final product is very much dependent on the methods of pre-treatment which precede catalysis. This is particularly applicable to the conditioning step wherein, on the one hand, the surfaces are cleaned while, on the other hand, the bore hole walls are prepared for the subsequent catalysis. The preparation is effected by means of particular surfactants which occupy the entire surface and have the marked property of adsorbing the catalyst nuclei. The actual catalyst application is followed by a treatment which is appropriate to the system and either removes interfering by-products from the catalyst treatment or converts the nuclei applied in the catalyst into their catalytically active form. Then the step of electroless metallization is carried out. In general, copper is deposited. Minor deviations from the pre-scribed process parameters in one of the process steps will usually lead to a defective metallization so that in many cases the final product is unusable.

Accordingly, one essential drawback inherent to these catalyst systems is the dependence of the nucleation density on the pre-treatment, the particle size and the after-treatment step. The higher the nucleation density, the better is the initial deposition rate or the denisty of the beginning electroless copper-plating, which is equivalent to a high quality through-hole plating. However, defective spots called "voids" in technical jargon, will tend very easily to occur, which voids will greatly reduce the quality of through-hole plating or even render the printed circuit boards unusable. But even under the optimum conditions a surface having been completely occupied with nuclei cannot be obtained. Moreover, the existing catalyst systems are susceptible to inadvertently imported alien ions. Thereby, the reproducibility of their mode of operation as well as the stability thereof are strongly deteriorated. Another disadvantage of the noble metal-containing catalyst systems is the high price of the metals used.

The technology of prior art employing an electroless metallization, followed by optional reinforcing by way of galvanic metal deposition, although it is being widely used, has some disadvantages which so far had to be put with due to the lack of feasible alternatives. Above all, the purely chemical metal deposition from reductively-working electrolytes is very expensive and requires an accurate technique of analysis and precise control of the electrolyte. Said electrolytes also contain the by far most expensive chemicals. Nevertheless, layers having been thus deposited are of a physically and mechanically poorer quality than metal layers obtained by electroplating. Another disadvantage of the technology employed so far resides in the uncertainty in the stabilization of the systems and, hence, also the uncertainty of whether the deposition rate and layer thickness in the bore hole walls are sufficiently reproducible. The electrolytes, due to their low stability, tend to undergo auto-decomposition. Moreover, said electrolytes, as a rule, contain formaldehyde as reducing agent which under aspects of industrial safety is to be avoided. Moreover, the reductively working electrolytes contain larger amounts of complex-forming agents which are poorly biodegradable and, therefore, constitute a considerable pollution of the waste water.

It has been attempted for long to evade a chemical metallization and instead to employ a direct galvanic metal deposition. Such a process has been described, for example, in the U.S. Pat. No. 3,099,608 and in the German Published Unexamined Patent Application (DE-OS) 33 04 004. However, the processes described therein have not been put into any practical use. Fairly utilizable results can be attained only with freshly prepared galvanically Working electrolytes. Already shortly after the begin of the operation the quality of the obtained metal deposit decreases to such an extent that from then only unusable results will be attained. Moreover, rather long periods of time are required for the metal deposition. Upon use of the process described in U.S. Pat. No. 3,099,608 at least 20 minutes are required for the metal deposition. Furthermore, defective spots (voids) will very rapidly occur to an increasing degree in the metallization. Thereby, metal layers are formed on the hole walls which do insufficiently adhere.

It is a first object of the present invention to develop a process for manufacturing single-layer or multi-layer printed circuit boards, said process allowing a safe, strongly adering and continuous activation to be effected of the employed substrate material, enabling direct galvanic metallization to be accomplished of the activated surfaces, reducing the number of process steps, thereby fast and inexpensively leading to products which are excellent in quality. The process is further intended to ensure high certainty with respect to a reproducible mode of operation. The subsequent metallization is intended to be feasible not only by the electroless route as conventional, but also via a direct galvanic process.

The object of the invention, surprisingly, been attained by using intrinsically electroconductive polymers as conductive surface for the activation, said polymers being produced from monomers via certain steps of oxidative pre- and after-treatments.

The process according to the invention is characterized in that a) the surfaces of the substrate are pre-treated in a solution having oxidizing activity, b) after removal of the residual solution by rinsing, the substrate is introduced into a solution which contains at least one monomer, and more specifically pyrrole, furane, thiophene or derivative(s) thereof, which in a polymeric or copolymeric form is electrically conductive, c) the substrate is then transferred into an acidic solution whereby an electrically conductive polymeric layer is formed, more specifically of polymerized or copolymerized pyrrole, furane, thiophene or derivative(s) thereof, whereupon, if desired or required, any residual solution is removed by rinsing, and the galvanic or electroless metallization is carried out.

It is particularly advantageous that the step a) is preceded by process steps wherein the through-bored printed circuit board is subjected to a process of initial etching and a surface preparation of the non-conducting areas of the conductor plates. Initial etching is effected by an acidic solution having oxidative activity. The treatment of the bore hole surfaces which are not conductive is effected by using organic, preferably nitrogen-containing solvents or aqueous alkaline solutions thereof.

The solution employed for the process step a) contains salts of permanganate, manganate, periodate and/or of a cerium(IV) compound. The oxidative pre-treatment as described in greater detail hereinbelow may be carried out in a pH range of from <1 to 14 and at a temperature of from 20° C. to 95° C. The addition of ionic or non-ionic surfactants in an amount of from 0.1 to 10 g/l improves the quality of the oxidative pre-treatment, is, however, not essential. The oxidative agents are present in a concentration ranging from 0.1 g/l to their solubility limits. The duration of pre-treatment may be between 0.5 and 20 minutes.

The solution employed for step b) contains from 1 to 50% of pyrrole or furane, thiophene, pyrrole derivatives or mixtures thereof, respectively, and further the complementary amount of solvents or solubility promoters and optionally also alkalizing additives. Of course, mixtures of solvents or solubility promoters may also be used. Usable as solvents or solubility promoters, respectively, are, e.g., water, methanol, ethanol, n-propanol, isopropanol, higher alcohols, polyalcohols, DMF (dimethyl formamide), ketones, more particularly methylethylketone, cumene sulfonate, N-methyl pyrrolidone, Triglyme, Diglyme, alkali metal salts of toluene sulfonates or their ethyl esters and aqueous alkaline solutions or mixtures thereof.

Subsequently to process step b), the articles to be metallized, such as printed circuit boards, are subjected to activation in the process step c). The activation may be carried out with oxidative substances such as, for example, alkali metal persulfates, alkali metal peroxodisulfates, hydrogen peroxide, iron(III) salts such as ferric chloride, ferric sulfate, potassium hexacyanoferrate(III), alkali metal periodates or similar compounds in an acidic medium. There is also the possibility to allow the activation to take place just in an acidic medium, for which hydrochloric acid, sulfuric acid, phosphoric acid etc. may be used as acids. The activation may be effected in an acidic oxidizing medium as well as in an acidic medium with permanent air purging.

Further galvanic processing following the process steps a), b) and c) of the articles to be metallized such as, e.g., printed circuit boards, is further illustrated in the following sections.

In a preferred embodiment of the process according to the invention, metals such as copper, nickel, gold, palladium, tin, lead, tin/lead are used for the preparation of the metal layer.

By means of the process according to the invention, there is obtained a through-hole plated single-layer or multi-layer printed circuit board based on a polymeric substrate material or on ceramics provided optionally on both sides with at least one electroconductive layer. This through-hole plated printed circuit board is characterized in that between the metal layer on the inner surface of the through-plated bore holes and the substrate material or the ceramics there is present a layer of polymerized electroconductive synthetic material. The layer composed of the electroconductive synthetic material, more specifically, consists of polymerized or copolymerized pyrrole, furane, thiophene or derivatives thereof. The layer of the synthetic polymer is preferred to have a thickness of from 0.1 to 10 μm. As an intermediate product, there is formed a perforated single-layer or multi-layer board based on a polymeric substrate material or on ceramics provided optionally on both sides with at least one electroconductive layer, while on the area contiguous to the bore hole a layer of electroconductive synthetic polymer is located which preferably consists of polymers or copolymers of pyrrole, furane, thiophene or derivatives thereof.

Electroconductive polymers have moved to the center of scientific interest in some recent years. However, so far they have not been put into any industrial use. The development and the present-day technical state of the art have been set forth in various review articles, for example by Herbert Naarmann, "Elektrisch leitfähige Polymere" in "Chemische Industrie", 6/87, pages 59 to 64; Klaus Menke and Siegmar Roth, "Metallisch leitfähige Polymere I und II" in "Chemie in unserer Zeit", 1/86, pages 1 to 10, and 2/86, pages 33 to 43. From the great number of various conductive polymers more particularly the systems containing de-localized π-electron systems have been selected. To be suitable appear systems based on furane, thiophene, pyrrole or the derivatives thereof. From prior art it has been known that a conductive polypyrrole may be prepared by electrochemical polymerization, but also by a merely chemical procedure {K. C. Khulke and R. S. Mann, "Journal of Polymer Science", Vol. 20 (1982), pages 1089 and 1095}.

In the EP-A-0 206 133 there is described a process for applying layers of electroconductive polymers, and more specifically of polypyrrole, onto other materials. The coating of various substrates is effected via a chemical route. Thus, the surface of a polyester film having a thickness of 42 μm is painted with a 10% by weight ethanolic solution of iron perchlorate. Upon evaporation of the solvent, the film thus treated is exposed at a temperature of 150° C. to an atmosphere containing 10% by volume of pyrrole vapor in nitrogen for 30 seconds. In the course thereof, within a few seconds a black layer is formed on the film surface. This insoluble polypyrrole layer has a specific conductivity of 10 S/cm. In the EP-A-0 206 133 there has also been mentioned that the polypyrrole layers be suitable for producing conductor tracks. In addition, the possibility has also been mentioned of depositing the monomers from a solution and employing an additional oxidation step; however, the advantage of operating in the gaseous state is emphasized. Indications on the adhesion strength of the obtained layers have not been provided and, more specifically, any subsequent metallization of the produced layers has by no means been rendered obvious.

The procedure described in prior art, however, is absolutely unsuitable for the manufacture of through-hole plated single-layer of multi-layer printed circuit boards. More particularly, a satisfactory deposition of the polypyrrole film on the interior surfaces of the bore holes could not be achieved. Practically useful results can be obtained only by observing the parameters of the process according to the invention. More specifically, the deposition of metal on the previously deposited layer of conductive polymer within a period of time which is realistic under process-technological aspects is exclusively rendered possible by the process according to the invention.

The substrate materials to be used include, more particularly, a glass fiber-reinforced epoxide resin, a polyimide and other solid polymers. Basically, any material is suitable which can be coated with a metal layer when treated by the process according to the invention. The through-hole plated printed circuit boards are preparable by the process according to the invention basically on different routes.

First, the metal may be deposited by aid of polymerized electroconductive heterocyclic compounds such as pyrrole, thiophene and furan with concommitant use of electroless reductive electrolytes.

A printed circuit board made of a substrate material such as glass fiber-reinforced epoxide resin which has been pre-treated by the pre-treatment method according to the invention—which method will be described hereinbelow—is placed in a reductive electrolyte so that a metal, preferably copper, is chemically deposited.

A different method of metal deposition employs polymeric electroconductive compounds, and more particularly pyrrole, thiophene and furane in the absence of electroless-working reductive electrolytes. Copper is preferred to be deposited by this method. A printed circuit board made of a substrate material such as glass fiber-reinforced epoxide resin which has been pre-treated by the pre-treatment method according to the invention—which method will be described hereinbelow—is placed in a galvanic copper electrolyte so that a copper deposition is effected on the pre-treated copper backing of the printed circuit board as well as on the pre-treated bore hole walls.

One variant of this procedures consists of a change in the after-treatment procedure. In accordance thereto, the conductive polymer film is formed only on the pre-treated bore hole walls, but not on the copper backing.

In a third procedure, the metal is deposited by aid of polymerized electroconductive heterocyclic compounds such as pyrrole, thiophene and furan with concommitant use of electroless reductive electrolytes or in the absence of electroless-working reductive electrolytes on substrate materials which have not been provided with a metal backing (additive process). A printed circuit board made of a substrate material such as glass fiber-reinforced epoxide resin which has been pre-treated by the pre-treatment method according to the invention—which method will be described hereinbelow—but has not been provided with a metal-backing is placed in a reductive copper electrolyte so that copper is chemically deposited. It is also possible to place the printed circuit board having not been provided with a metal-backing directly in a galvanic copper electrolyte and to induce a copper deposition to occur on the entire surfae of the printed circuit board.

Thus, the process according to the invention makes it possible to produce through-bored printed circuit boards by way of subtractive, semi-additive and additive techniques.

In the subtractive technique, copper-backed substrate materials are employed, for example glass fiber-reinforced epoxide resin. The drilled circuit board is pre-treated by the process according to the invention and is through-plated by way of electroless or, preferably, direct galvanic metal deposition. The through-plated printed circuit boards may then be subjected in a per se known manner to screen printing or photo-printing operations to create the conductor image after exposure and development. Then the conductor pattern is built up by galvanic deposition of metallic layers. The further process steps as necessary are carried out in a per se known manner such as described, for example, in Hermann, "Handbuch der Leiterplattentechnik". According to the so-called tenting technique, the printed circuit boards having been through-plated by the process according to the invention may also be superficially galvano-metallized via the direct route to produce the required layer thickness. In positive-print a photoresist is applied, which protects the conductor image and the bores during etching procedure as subsequently necessary.

In the semi-additive technique, an un-backed substrate material may be used which is pre-treated according to the invention, activated and then metallized. These steps are followed by the photo process and the formation of the conductor image in a per se known manner. However, a copper-backed substrate material, preferably bearing copper foil of from 5 to 12 μm in thickness, which is pre-treated according to the invention, activated and dried. Then, the photoresist is applied, and the conductor image is negatively created after exposure and development. Then the conductor image is selectively enhanced. The further procedures are carried out in a per se known manner.

The processes according to the invention, due to variation within one process step, open absolutely novel methods of the manufacture of printed circuit boards so that it becomes possible to selectively carry out the construction of the conductor tracks and the through-metallization of the bore holes.

The metallization of the substrate materials is carried out, for example, by that the construction of the conductor tracks and the through-metallization of the materials having prepared accordingly are effected on substrates having already been coated with photoresist.

For a further process variant, the bored and copper-backed substrate materials are initially etched, conditioned and then supplied to the oxidative pre-treatment (step a)). After the removal of the residual solution by rinsing, the substrate is introduced into a solution which contains a monomer, and more specifically pyrrole or derivative(s) of pyrrole or mixtures of furane, furane derivatives, thiophene, thiophene derivative(s) with pyrrole (step b)).

Thereafter, the substrate is introduced into an acidic solution so that the electrically conductive polymer layer is being formed (step c)).

Then, the substrate is rinsed, dried and coated with a photoresist, exposed through a desired conductor track pattern and then developed, whereby the bores and the conductor image are uncovered. The substrate having been thus pre-treated can be placed in a suitable copper electrolyte for galvanically enforcing the conductor tracks and for through-plating the bore holes so that a galvanic deposition occurs only within the resist channel and the bore holes, respectively.

In the additive technique there is employed an unbacked substrate material. The areas, conductor tracks and so on to be metallized are selectively activated, followed by chemical and/or galvanic metallization. Hereby, a direct build-up of the conductor image is effected.

A variation of the above-mentioned additive technique is characterized by the following process steps:

The drilled substrate plate is treated so that it has a best-prepared surface for the lamination of a photoresist. The substrate having been thus prepared is coated with photoresist, exposed through a desired conductor track pattern mask and then developed, whereby the bores and the conductor image are uncovered. The substrate is then etched, conditioned and passed to the oxidative pre-treatment {a)}. After the removal of the remainders of solvent the substrate is passed into one of the above-mentioned heterocyclic(s)-containing solutioon {step b)}.

Subsequently thereto, the substrate is placed in an acidic solution so that the electroconductive layer may form {c)}.

The substrate having been thus pre-treated is then rid of polymer layers adhering to the photoresist by intensive rinsing, brushing, mechanical cleaning by using suitable means or a combinations of said cleaning operations. Thereafter, the substrate is treated in a conventional pickling procedure and subjected to galvanic metallization, the metallization being effected only in the resist channel and in the bore holes.

Hereinbelow, the process steps of the process according to the invention will be explained in greater detail.

The process according to the invention may be characterized by the following general procedures:

| 1. Oxidative pre-treatment | a) |
|---|---|
| 2. Rinsing | |
| 3. Catalysis | b) |
| 4. Activating | c) |
| 5. Rinsing | |
| 6. Electroless metallization | |
| 7. Rinsing | |
| 8. Pickling | |
| 9. Copper pre-enforcing (galvanic). | |

If the through-hole plated printed circuit board is intended to be made by direct galvanic copper-plating, then the procedure may be as follows:

| 1. Oxidative pre-treatment | a) |
|---|---|
| 2. Rinsing | |
| 3. Catalysis | b) |
| 4. Activating | c) |
| 5. Rinsing | |
| 6. Pickling | |
| 7. Galvanic copper-plating. | |

In a preferred embodiment of the process according to the invention, prior to the step a) comprising the oxidative pre-treatment there may be carried out a procedure for initially etching, a rinsing operation, a cleaning step and a cleaning and surface treatment of the bore holes, followed by a further rinsing step.

If the substrate materials do already comprise an electroconductive layer made of copper, then the initial etching of the printed circuit board is carried out in a commercially available acidic solution provided with oxidants, so that all accessible copper areas are provided with a uniform finely textured surface. After the treatment, the surface should be free from oxidic regions, from finger prints and from other contaminations and should exhibit a uniform bright color.

The process step of cleaning and surface treatment of the non-conductive areas of the printed circuit board (bore hole walls) which, in addition to its cleaning effect, also causes the non-conductive areas of the printed circuit board to become activated and conditioned, is carried out by means of an organic solvent, preferably a nitrogen-containing solvent, or with an aqueous alkaline solution of the respective solvents. This process step does not only provide the activating and conditioning effects, but in the case of multi-layer circuits also causes any contaminants, if present, of the copper inlays on the bore hole walls to be prepared for the subsequent removal of the contaminants. The duration of treatment should generally be between 1 and 20 minutes and be carried out at temperatures of from 20° C. to 80° C. The preceding steps provide an optimum pre-treatment of the printed circuit boards for the subsequent process.

In order to prepare the printed circuit boards for a galvanic or chemical metallization, said printed circuit boards must be subjected to an oxidative pre-treatment, a). The oxidative pre-treatment may be carried out in a pH range of from <1 to 14 and at a temperature of from 20° C. to 95° C. The addition of ionic or non-ionic surfactants in an amount of from 0.1 to 10 g/l improves the quality of the oxidative pre-treatment, is, however, not essential. The oxidative agents are present in a concentration ranging from 0.1 g/l to their solubility limits. The duration of pre-treatment may be between 0.5 and 20 minutes. As the oxidants there may be used, for example, cerium(IV) sulfate, alkali metal manganates, alkali metal permanganates and alkali metal periodates. Potassium permanganate is preferred to be used.

As the oxidative medium for pre-treating the articles to be metallized under alkaline conditions there is prepared an aqueous solution containing 20 g/l of potassium permanganate and 10 g/l of sodium hydroxide. It is advantageous to add about 0.1 g/l of a non-ionic fluoro-surfactant to the solution. The printed circuit boards are preferably left in the tempered solution with slight motion for 10 minutes. After the pre-treatment the printed circuit boards are rinsed with water.

As the oxidative medium for pre-treating the articles to be metallized under neutral conditions there is prepared an aqueous solution containing 12 g/l of potassium permanganate and 0.1 g/l of a non-ionic fluoro-surfactant, pH-regulating substances (sodium hydroxide, sulfuric acid etc.) being used for adjusting the pH of the solution to about 7. The printed circuit boards to be treated are preferably left in the solution tempered at about 65° C. with slight motion for 5 minutes. After the oxidative pre-treatment the printed circuit boards are rinsed with water.

As the oxidizing medium for pre-treating the articles to be metallized under acidic conditions there is prepared an aqueous solution containing 10 g/l of potassium permanganate, 0.1 g/l of a non-ionic wetting agent and sulfuric acid so that the solution has a pH value of about 2. The printed circuit boards to be treated are preferably left in the solution with slight motion for about 1 minute. The temperature of the solution is preferably 20° C. to 30° C. After the oxidative pre-treatment the printed circuit boards are rinsed with water.

As the oxidizing medium, there is prepared an aqueous solution of 50 g/l of cerium(IV) sulfate, a non-ionic surfactant and sulfuric acid is prepared so that the pH value of the solution is <1. The printed circuit boards to be treated are preferably left in the solution tempered at 20° C. to 30° C. with slight waving motions for about 5 minutes. After the oxidative pre-treatment the printed circuit boards are rinsed with water.

As a further oxidizing medium, there is prepared an aqueous solution of 50 g/l of sodium periodate, a non-ionic surfactant and sulfuric acid is prepared so that the pH value of the solution is <1. The printed circuit boards to be treated are preferably left in the tempered solution with slight waving motions for 5 minutes. After the oxidative pre-treatment the printed circuit boards are rinsed with water.

For the catalysis process step b) there is employed a solution consisting of a heterocyclic compound, more specifically pyrrole, thiophene or furane, a water-miscible organic solvent such as methanol, ethanol, n-propanol, isopropanol, higher alcohols, polyalcohols, DMF (dimethyl formamide), ketones, cumene sulfonate, N-methyl pyrrolidone, Triglyme, Diglyme, alkali metal salt of the toluene sulfonates or the ethyl esters, and aqueous alkaline solutions or mixtures thereof as solubility promoters/solubilizers for the heterocyclic compound and water. The substrates (printed circuit boards) to be metallized are placed in this solution. Due to the high reactivity of the articles that have been oxidatively pre-treated, such as printed circuit boards, the concentration of the heterocyclic(s)—containing catalysis solution may be within a wide range so that solutions containing from 0.1 to 50% of heterocyclics may be employed. However, it has been found that the optimum of catalyzing properties is exhibited by solutions containing from 5 to 35% of heterocyclic(s). The residence time of the articles such as printed circuit boards in the catalyst solution may range from a few seconds to 20 minutes. The optimum range of residence times has been found to be between 1 and 5 minutes. During the treatment of the substrates such as printed circuit boards in the catalyst solutions, the substrates may be subjected to slight motion. The Table set forth hereinbelow shows a list of preferably usable catalyst solution.

After the catalysis, the articles to be metallized, such as printed circuit boards, are subjected to an activation, c), as a preparation for the following metal deposition. The activation may be effected with oxidizing substances such as, for example, alkali metal persulfates, alkali metal peroxodisulfates, hydrogen peroxide, iron-(III) salts such as ferric chloride, ferric sulfate, potassium hexacyanoferrate(III), alkali metal periodates or similar compounds in an acidic medium. There is also the possibility to allow the activation to take place alone in an acidic medium, for which hydrochloric acid, sulfuric acid, phosphoric acid etc. may be used as acids. The activation may also be effected in an acidic medium with permanent air purging.

For the activation in an acidic oxidizing medium of the articles to be metallized, the catalyzed substrate is kept in an aqueous solution containing 50 g/l of sodium peroxodisulfate and 10 ml/l of sulfuric acid with slight waving motions for 5 minutes. A film of dark brown or black color is formed on the surface of the printed circuit board and on the bore hole walls. After the activation, the activated substrate is rinsed with running water.

A catalyzed substrate is kept in an aqueous solution containing 40 g/l of potassium hexacyanoferrate(III) and 20 ml/l of sulfuric acid with slight waving motions for 4 minutes. A dark voluminous film is formed on the entire surface of the printed circuit board. After the activation, the activated substrate is rinsed with running water.

The activation of the articles to be metallized in an aqueous solution containing 20 g/l of alkali metal periodate and 40 ml/l of sulfuric acid is effected with slight waving motions within 2 minutes. A black film is formed on the entire surface.

Furthermore, the activation may be effected in an aqueous solution comprising 50 g/l of iron(III) sulfate and 30 ml/l of sulfuric acid. A catalyzed substrate is preferably kept in this solution with slight waving motions for 5 minutes. A dark-colored coating is formed on the entire surface. After the activation, the activated substrate is rinsed with running water.

In acidic medium consisting of 20% aqueous solution of sulfuric acid, the activation of the articles to be metallized is effected with slight waving motions and under permanent air purging within about 5 minutes. After the activation, the activated substrate is rinsed with running water.

If a 5% aqueous hydrochloric acid solution is employed for activation, the substrate accordingly pretreated is left in the solution with slight waving motions preferably for 10 minutes. Also after the activation with 5% hydrochloric acid, the activated substrate is rinsed with water.

If an 8% aqueous phosphoric acid solution is used, the substrate to be activated is left in said solution with slight waving motions and under permanent air purging for 10 minutes. After the activation, the activated substrate is rinsed with water.

The activation may also be carried out by keeping a substrate which has been pre-treated according to the invention is kept in an aqueous solution containing 60 g/l of sodium peroxodisulfate and 40 ml/l of $H_2SO_4$ with slight waving motions and under permanent air purging for 10 minutes. Also after this kind of activation, the activated substrate is rinsed with water.

In a further preferred embodiment a catalyzed substrate is exposed to the action of an aqueous solution containing 100 ml/l of sulfuric acid and 25 ml/l of aqueous hydrogen peroxide solution (30%) with slight waving motions under permanent air purging for about 3 minutes. Also here after the activation, the activated substrate is rinsed with water.

The amounts of grams and milliliters mentioned above are relative to a total of 1 liter of aqueous solution, and the concentrations by weight and by volume are in g/ml or ml/l, respectively.

Immediately after the activation, the articles such as printed circuit boards treated according to the above-described process may be subjected to an electroless reductive metal deposition. It is also possible immediately after the completion of the activation to galvanically deposit the metal. Moreover, the activated articles such as printed circuit boards may be later on electroplated with metals.

For the electroless metallization there are employed commercially available electrolytes, and preferably copper electrolytes such as, e.g., METALYT® CU NV, under the conventional conditions as known to the artisan.

The electro-deposition of metals is also effected by using known galvanic electrolytes. Basically, all metals or alloys may be deposited which are capable of being used for electro-plated. However, it is preferred to use copper electrolytes. Particularly preferred are copper electrolyte solutions comprising sulfuric acid which have a content of from 50 to 300 g/l of free sulfuric acid and a metal content of from 5 to 50 g/l. However, electrolytes containing fluoroboric acid, hydrochloric acid, thiosulfate or pyrophosphate or cyanidic electrolytes as well as electrolytes based on sulfamines and organic sulfonic acids have proven to be suitable. The electrolytic deposition is effected under the conventional conditions, namely between 20° C. and 70° C. with current densities of between 0.1 to 20 A/dm$^2$. Surprisingly, the period required for the electrodeposition may be significantly shortened, if the galvanic copper deposition is carried out immediately after the activation according to the invention, so that in particularly favourable cases said period will amount to from 2 to 5 minutes. The metal layers obtained are uniform, continuous and, in addition, firmly adhering, which also do not show any defective spots in the so-called through-light test.

The process according to the invention is further illustrated by way of the following examples.

EXAMPLE 1

A substrate material made of a glass fiber-reinforced epoxide resin which has been copper-coated on both sides is in the conventional manner provided with bore holes and mechanically cleaned. Then the substrate is subjected to the oxidative pre-treatment in a sulfuric acid-containing aqueous solution of 50 g/l of cerium-(IV) sulfate with use of a nonionic fluorosurfactant. The printed circuit board is kept in the solution maintained at a temperature of from 20° C. to 30° C. with slight motion for 5 minutes, and is subsequently rinsed. Thereafter, the printed circuit board is immersed in an aqueous catalyst solution containing 20% of pyrrole and 20% of isopropanol at room temperature with slight motion for 5 minutes. Then the printed circuit board is immersed in an aqueous solution containing 50 g/l of sodium peroxodisulfate and 10 ml/l of sulfuric acid with slight motion for another 5 minutes. A conductive polymer film of dark brown to black color forms on the surface and on the bore hole walls. The treated board is then rinsed with running water, pickled with 20% aqueous sulfuric acid and copper-plated in a commercially available copper electrolyte bath. As the electrolyte, there is employed Applicants' commercial product CU-PROSTAR LP-1. This electrolyte is composed as follows:

| | |
|---|---|
| Copper: | 18–22 g/l |
| Sulfuric acid: | 180–250 g/l |
| Sodium chloride: | 60–100 mg/l |
| Additive based on a polyether: | 4–8 ml/l |

The temperature is 20°–30° C., and the current density is 2–4 A/dm$^2$ After only 8 minutes all bore holes are completely metallized.

EXAMPLE 2

A substrate as in Example 1 was subjected to an oxidative treatment in an aqueous solution containing 20 g/l of potassium permanganate, 10 g/l of sodium hydroxide and 0.1 g/l of a non-ionic fluoro-surfactant at 90° C. with motion. After a rinsing procedure the substrate is immersed in an aqueous solution containing 10% of pyrrole, 15% of isopropanol and 0.1 g/l of a fluorosurfactant at room temperature for 10 minutes. The substrate is slightly agitated to ensure a good exchange of liquid in the bore holes. This step is followed by a treatment in an aqueous solution containing 20 g/l of hydrogen peroxide and about 20% of sulfuric acid. The substrate is exposed at room temperature with agitation for about 8 minutes. A conductive polypyrrole film of dark brown to black color is formed. The treated board is then rinsed with running water and directly electroplated with copper as described in Example 1.

After about 5 minutes all bore holes are completely and uniformly metallized with a firmly adhering continuous metal layer.

The printed circuit boards having been thus through-hole metallized are galvanically enforced to a copper layer thickness of 25 μm in the bore. A thermal shock test according to MIL Spec.-P-55110-C is passed without giving any problem.

EXAMPLE 3

A substrate as in Example 1 is subjected to an oxidative treatment in an aqueous solution containing 20 g/l of potassium permanganate, 10 g/l of sodium hydroxide and 0.1 g/l of a non-ionic fluoro-surfactant at 90° C. with motion. After a rinsing procedure the substrate is immersed in an aqueous solution containing 10% of pyrrole, 10% of furane, 15% of isopropanol and 0.1 g/l of a fluorosurfactant at room temperature for 10 minutes. The substrate is slightly agitated to ensure a good exchange of liquid in the bore holes. This step is followed by a treatment in an aqueous solution containing 20 g/l of hydrogen peroxide and about 20% of sulfuric acid. The substrate is exposed at room temperature with agitation for about 8 minutes. A conductive polymer film of dark brown to black color is formed. The treated board is then rinsed with running water and directly electroplated with copper as described in Example 1.

After about 8 minutes all bore holes are completely and uniformly metallized with a firmly adhering continuous metal layer. The printed circuit boards having been thus through-hole metallized are galvanically enforced to a copper layer thickness of 25 μm in the bore. A thermal shock test according to MIL Spec.-P-55110-C is passed without giving any problem.

EXAMPLE 4

A substrate material made of a glass fiber-reinforced epoxide resin which has not been copper-coated is pretreated, catalyzed and activated according to the procedure of Example 2. The obtained printed circuit board is directly electro-plated with copper. After about 10 minutes all of the surface and bore holes are completely and uniformly metallized with a firmly adhering continuous metal layer.

EXAMPLE 5

A substrate material made of a glass fiber-reinforced epoxide resin which has been copper-coated on both sides is in the conventional manner provided with bore holes and mechanically cleaned. Then the substrate is subjected to the oxidative pre-treatment in an aqueous solution of 25 g/l of potassium manganate and 10 g/l of potassium hydroxide at 70° C. with slight waving motion for 10 minutes, and is subsequently rinsed. Thereafter, the printed circuit board is immersed in a solution consisting of 25% of butanol, 50% of water, 10% of pyrrole, 2% of an aqueous sodium hydroxide solution (30%) and 13% of an aqueous cumene sulfonate solution (40%) for 5 minutes.

Thereafter, the printed circuit board is maintained in a solution containing 300 ml/l of sulfuric acid and 20 g/l of sodium peroxodisulfate. A conductive polymer film of dark brown to black color is formed on the surface and on the bore hole walls. The treated board is then rinsed with running water, pickled in a 20% sulfuric acid solution and then electroplated with copper in LP-1 (see Example 1). After 10 minutes all bore holes are completely and uniformly metallized with a firmly adhering continuous metal layer.

EXAMPLE 6

A printed circuit board as in Example 1 is subjected to an oxidative treatment in an aqueous solution containing 20 g/l of potassium manganate and 20 g/l of potassium hydroxide at 80° C. with slight waving motions for 10 minutes. Then the substrate is immersed in a solution consisting of 25% of glycerol, 25% of Triglyme, 35% of water and 15% of pyrrole with slight waving motion for 10 minutes. The board is removed from the bath, and the liquid is allowed to drain for 2 minutes. Then the board is transferred into an aqueous solution containing 50 g/l of sodium peroxodisulfate and 100 ml/l of sulfuric acid and maintained therein with slight waving motion and permanent air purging for 5 minutes. A dark brown to black film is formed all over the surface of the board, which is then rinsed with running water. The printed circuit board having thus been treated is pickled in a 20% sulfuric acid solution and then electroplated in a copper electrolyte (see Example 1). After 8 minutes all bore hole walls are completely and uniformly metallized with a firmly adhering continuous metal layer.

EXAMPLE 7

Subsequently to the oxidative pre-treatment under alkaline conditions (hereto see Example 6), the printed circuit board is immersed in a solution consisting of 10% of water, 20% of Triglyme, 30% of N-methylpyrrolidone, 20% of pyrrole and 20% of DMF with slight waving motion for 5 minutes. After catalysis, the treated board is maintained in an aqueous solution containing 5 g/l of sodium peroxodisulfate and 50 ml/l of sulfuric acid and maintained therein with slight waving motion and permanent air purging for 5 minutes. The subsequent treatment is as described in Example 6.

EXAMPLE 8

A multi-layer printed circuit (8 inner layers) is in the conventional manner provided with bore holes and mechanically cleaned. Then the substrate is subjected to an oxidative pre-treatment under alkaline conditions in an aqueous solution containing 30 g/l of potassium permanganate and 30 g/l of sodium hydroxide at a temperature of from 75° C. with slight motion for about 7 minutes, and is subsequently rinsed. Then the printed circuit board is immersed in a catalyst solution consisting of 66% of glycerol, 27% of N-methylpyrrolidone and 7% of pyrrole at room temperature for 5 minutes. After catalysis, the catalyzed multi-layer board is subsequently treated in an aqueous solution containing about 30% by volume of sulfuric acid with slight waving motion and permanent air purging for 5 minutes. The subsequent treatment is as described in Example 6.

EXAMPLE 9

A printed circuit board is pre-treated and catalyzed as described in Example 2, except that a 20% aqueous sulfuric acid solution purged with air is used in the activation step. The residence time of the substrate is 5 minutes with agitation. A conductive polypyrrole film of dark brown to black color is formed which only adheres in the bore holes. The copper-backed surface has not been covered. Then the substrate is rinsed and dried. The printed circuit board is coated with a commercially available photoresist and exposed to light and developed so that then the conductor image is uncovered. Then the substrate is selectively enforced to a layer thickness of 25 μm in the resist channel and in the bore holes by means of a galvanic copper electrolyte. The printed circuit board having been thus through-metallized may be further processed in the conventional manner.

COMPARATIVE EXAMPLE

A printed circuit which in the conventional manner has been provided with bore holes and mechanically cleaned is maintained in a solution consisting of 66% of glycerol, 27% of N-methylpyrrolidone and 7% of pyrrole for about 3 minutes. The treated printed circuit board is then treated in an aqueous solution containing about 30% by volume of sulfuric acid with slight waving motion and air purging for 5 minutes. After rinsing and pickling in a 20% sulfuric acid solution, the board is subjected to electro-plating in a commercially copper electrolyte at a current density of 4 A/dm$^2$. There after, no copper deposition could be observed on the bore hole walles.

The printed circuit boards of the Examples 1 through 9 and of the Comparative Example, after the mechanical cleaning, are subjected to the process steps of:

Initial etching, rinsing, cleaning and surface preparation of the bore hole walls and once more rinsing.

The amounts of grams and milliliters mentioned above are relative to 1 liter of solution, the solvent being water unless mentioned otherwise.

Some further Examples for preferred compositions for the baths employed in step b) according to claim 1 for catalyzing the substrate and the preferred residence times of the substrate in the respective baths are set forth in the following Table.

TABLE

| No. in ml | 10 | 11 | 12 | 13 | 14 | 15 | 16 | 17 | 18 | 19 | 20 | 21 |
|---|---|---|---|---|---|---|---|---|---|---|---|---|
| Pyrrole | 5 | 10 | 10 | 10 | 20 | 30 | 5 | 30 | 3 | 15 | 30 | 20 |
| Water | 55 | 65 | 50 | 50 | 45 | 20 | 55 | — | 47 | 35 | 10 | 30 |
| Glycerol | 40 | — | — | — | — | — | — | — | — | — | — | — |
| Glycol | — | 30 | — | — | — | — | — | — | 50 | 25 | — | — |
| Aq. cumene sulfonate (40%) | — | — | — | — | 30 | — | — | — | — | — | — | — |
| Aq. NaOH | — | — | — | — | — | 5 | — | — | — | — | — | — |
| Trigylme | — | — | 40 | — | — | — | — | — | — | 25 | 20 | — |
| Diglyme | — | — | — | 40 | — | — | — | — | — | — | — | — |
| DMF | — | — | — | — | — | 50 | — | — | — | — | 10 | — |
| N-Methyl-pyrrolidone | — | — | — | — | — | — | 40 | 20 | 20 | — | 30 | — |
| Methylethylketone | — | — | — | — | — | — | — | — | — | — | — | 50 |
| Residence time: Minutes | 3 | 10 | 2 | 2 | 5 | 10 | 15 | 3 | 1.5 | 1 | 1.5 | 1 |

We claim:

1. A through-hole plated single-layer or multi-layer printed circuit board based on a polymeric substrate or ceramic material provided on one or both sides with an electroconductive layer, characterized in that a layer of electroconductive synthetic polymer is present between the metal layer of the area enclosing the bore hole and the polymeric substrate or ceramic material, said metal layer being formed by a process of electrolytic metallization.

2. The through-hole plated single-layer or multi-layer printed circuit board according to claim 1, characterized in that the layer of the electroconductive synthetic polymer consists of polymerized or copolymerized pyrrole, furane, thiophene or derivative(s) thereof.

3. The through-hole plated single-layer or multi-layer printed circuit board according to claim 1, characterized in that the layer of the electroconductive synthetic polymer is from 0.1 to 10 μm in thickness.

4. A process for manufacturing through-hole plated single-layer or multi-layer printed circuit boards
   said boards based on a polymeric substrate or a ceramic material provided on one or both sides with an electroconductive layer,
   said process comprising electrolytic metallization also on surfaces of the polymeric substrate or ceramic material which are not provided with the electroconductive layer(s), whereby a metal layer is formed,
characterized in that
   a) the surfaces of the polymeric substrate or ceramic material are pre-treated in a solution having oxidizing activity,
   b) after removal of the residual solution by rinsing, the polymeric substrate or ceramic material is immersed into a solution which contains at least one monomer out of the group of pyrrole, furane, thiophene or derivative(s) thereof, which in a polymeric or copolymeric form is electrically conductive, whereby the monomers are deposited onto the surfaces of the polymeric substrate or ceramic material,
   c) the polymeric substrate or ceramic material is then transferred into an acidic optionally oxidizing solution whereby an electroconductive polymeric layer of polymerized or copolymerized pyrrole, furane, thiophene or derivative(s) thereof is formed from the monomer deposited in step b), whereupon the electrolytic metallization is carried out after, if desired or required, any residual solution is removed by rinsing.

5. The process according to claim 4, characterized in that the step a) is preceded by process steps wherein the through-bored printed circuit boards are subjected to a process of initial etching and a surface preparation of the non-conducting areas of the conductor plates.

6. The process according to claim 5, characterized in that the initial etching of the printed circuit board is effected by an acidic solution having oxidative activity.

7. The process according to claim 5, characterized in that organic solvents or aqueous alkaline solutions thereof are employed for the surface preparation.

8. The process according to claim 7, characterized in that the organic solvents contain nitrogen.

9. The process for manufacturing through-hole plated single-layer or multi-layer printed circuit boards according to any one of claim 4, characterized in that the metal layer consists of one of the metals or alloys, copper, nickel, gold, palladium, tin, lead, tin/lead.

10. The process according to claim 4, characterized in that the solution of step a) contains oxidizing permanganate, manganate, periodate salts and/or cerium(IV) sulfate.

11. The process according to claim 4, characterized in that the pH value of the oxidizing solution is between less than 1 and 14.

12. The process according to claim 4, characterized in that the oxidizing solution contains a surfactant.

13. The process according to claim 4, characterized in that the solution for carrying out step b) contains from 1 to 50% of pyrrole, furane and/or thiophene and from 99 to 50% of a solvent or solubilizer or from 99 to 50% of a mixture comprising a solvent and a solubilizer.

14. The process according to claim 13, characterized in that the solubilizers or solvents are water, methanol, ethanol, n-propanol, isopropanol, higher alcohols, polyalcohols, DMF (dimethyl formamide), ketones, cumene sulfonate, N-methyl pyrrolidone, Triglyme, Diglyme, alkali metal salt of toluene sulfonates or their ethyl esters and aqueous alkaline solutions or mixtures thereof.

15. A bored single-layer or multi-layer printed circuit board, said board based on a polymeric substrate or a ceramic material provided on one or both sides with an electroconductive layer, wherein on the area enclosing the bore hole a layer of electroconductive synthetic polymer is located which was made according to steps a), b) and c) of claim 4.

* * * * *